(12) United States Patent
Lu et al.

(10) Patent No.: US 10,817,025 B2
(45) Date of Patent: Oct. 27, 2020

(54) NARROW-BEZEL DISPLAY MODULE AND DISPLAY DEVICE

(71) Applicant: WUHAN CHINA STAR OPTOELECTRONICS TECHNOLOGY CO., LTD., Wuhan (CN)

(72) Inventors: Yantao Lu, Wuhan (CN); Xin Zhang, Wuhan (CN)

(*) Notice: Subject to any disclaimer, the term of this patent is extended or adjusted under 35 U.S.C. 154(b) by 0 days.

(21) Appl. No.: 16/475,380

(22) PCT Filed: Mar. 6, 2019

(86) PCT No.: PCT/CN2019/077160
§ 371 (c)(1),
(2) Date: Jul. 2, 2019

(87) PCT Pub. No.: WO2020/133696
PCT Pub. Date: Jul. 2, 2020

(65) Prior Publication Data
US 2020/0249721 A1    Aug. 6, 2020

(30) Foreign Application Priority Data
Dec. 29, 2018 (CN) .......................... 2018 1 1646580

(51) Int. Cl.
*H05K 1/00* (2006.01)
*G06F 1/16* (2006.01)
*H01L 27/32* (2006.01)
*H01L 51/00* (2006.01)

(52) U.S. Cl.
CPC ........ *G06F 1/1652* (2013.01); *H01L 27/3248* (2013.01); *H01L 51/0097* (2013.01)

(58) Field of Classification Search
USPC .......................................... 361/749
See application file for complete search history.

(56) References Cited

U.S. PATENT DOCUMENTS

| 10,049,948 B2 * | 8/2018 | Gaff | .................... H01L 21/6831 |
| 2017/0068275 A1 * | 3/2017 | Lee | .................... H04M 1/0268 |

* cited by examiner

Primary Examiner — Andargie M Aychillhum (57) ABSTRACT

A narrow-bezel display module includes a display panel, a drive chip, and a flexible printed circuit board. The display panel includes a glass substrate and a TFT substrate. The glass substrate includes a bottom border. The drive chip is attached on the bottom border of the glass substrate. The drive chip includes an output end and an input end arranged opposite to each other and two side surfaces. The input end is connected to a first metal layer of the TFT substrate. The output end is connected to a second metal layer of the TFT substrate. The flexible printed circuit board includes conductive leads and a first connection portion and a second connection portion extended from one side of the conductive leads. The first connection portion and the second connection portion are connected to the input end from the two side surfaces respectively.

20 Claims, 5 Drawing Sheets

NARROW-BEZEL DISPLAY MODULE AND DISPLAY DEVICE

1. FIELD OF DISCLOSURE

The present invention relates to a field of display devices and in particular, to a narrow-bezel display module and a display device.

2. DESCRIPTION OF RELATED ART

Because a screen ratio of a display panel is constantly increasing, a bottom border of the display panel is made as narrow as possible. At present, the bottom border of the display panel has two bonding methods: a chip on flexible printed circuit (chip on FPC) board and chip on glass (COG). In the case of COQ an integrated circuit (IC) and a flexible printed circuit board (FPC) need to be bonded to a glass substrate. However, because an input end of the IC is close to the FPC, an output end of the IC is close to a display region, and a portion of the FPC needs to be connected to the input end of the IC, so that the bottom border of the display panel cannot be reduced and a size of the bottom border is too large.

In view of this, it is necessary to provide a COG method for bonding a drive chip to the glass substrate, which can reduce the bottom border and thereby solves existing problems in conventional techniques.

SUMMARY

In conventional techniques, an input end of an integrated circuit (IC) is close to a flexible printed circuit board (FPC), an output end of the IC is close to a display region, and a portion of the FPC need to be connected to the input end of the IC, so a bottom border of a display panel cannot be reduced and a size of the bottom border is too large.

The present invention provides a narrow-bezel display panel and a display device, which reduces a wiring distance between a flexible printed circuit board and a drive chip, and thereby increases a screen ratio.

Accordingly, the present invention provides a narrow-bezel display module, comprising:

a display panel comprising a glass substrate and a thin film transistor (TFT) substrate disposed on the glass substrate, wherein the glass substrate includes a bottom border protruding from one side of the TFT substrate;

a drive chip attached on the bottom border of the glass substrate, the drive chip comprising an output end and an input end disposed opposite to each other and two side surfaces adjacent and connected to the output end and the input end, the input end connected to a first metal layer of the TFT substrate, the output end connected to a second metal layer of the TFT substrate; and a flexible printed circuit board comprising a plurality of conductive leads and a first connection portion and a second connection portion, the first connection portion and the second connection portion extended from one side of the conductive leads, the first connection portion and the second connection portion connected to the input end from the two side surfaces respectively, the output end transmitting an output signal to the display panel through the second metal layer, wherein when the first connection portion and the second connection portion are connected to the input end, the first connection portion and the second connection portion are connected to the drive chip at a horizontal flush, higher, or lower level than a height of the drive chip.

According to one embodiment of the present invention, the drive chip comprises an upper surface and a lower surface disposed opposite to each other; when the drive chip is rotated by 180 degrees, the upper surface of the drive chip is attached onto the glass substrate, the input end is disposed adjacent to the TFT substrate, and the output end is disposed away from the TFT substrate; and when the drive chip is not rotated, the lower surface of the drive chip is attached onto the glass substrate, the output end is disposed adjacent to the TFT substrate, and the input end is disposed away from the TFT substrate.

According to one embodiment of the present invention, the flexible printed circuit board further comprises a first extended portion and a second extended portion connected to the first connection portion and the second connection portion respectively, the first extended portion and the first connection portion form a U shape, and the second connection portion and the second extended portion form a U shape.

According to one embodiment of the present invention, the conductive leads of the flexible printed circuit board protrude from the bottom border and are not connected to the glass substrate.

According to one embodiment of the present invention, the display panel further comprises a display region and a non-display region surrounding the display region, and the bottom border is disposed in the non-display region.

Accordingly, the present invention provides a narrow-bezel display module, comprising:

a display panel comprising a glass substrate and a thin film transistor (TFT) substrate disposed on the glass substrate, wherein the glass substrate comprises a bottom border protruding from one side of the TFT substrate;

a drive chip attached on the bottom border of the glass substrate, the drive chip comprising an output end and an input end disposed opposite to each other and two side surfaces adjacent and connected to the output end and the input end, the input end connected to a first metal layer of the TFT substrate, the output end connected to a second metal layer of the TFT substrate; and a flexible printed circuit board comprising a plurality of conductive leads and a first connection portion and a second connection portion, the first connection portion and the second connection portion extended from one side of the conductive leads, the first connection portion and the second connection portion connected to the input end from the two side surfaces respectively, the output end transmitting an output signal to the display panel through the second metal layer.

According to one embodiment of the present invention, when the first connection portion and the second connection portion are connected to the input end, the first connection portion and the second connection portion are connected to the drive chip at a horizontal flush, higher, or lower level than a height of the drive chip.

According to one embodiment of the present invention, the first metal layer and the second metal layer are disposed at different layers, the first metal layer is a gate electrode layer, and the second metal layer is a source/drain electrode layer.

According to one embodiment of the present invention, the drive chip comprises an upper surface and a lower surface disposed opposite to each other; when the drive chip is rotated by 180 degrees, the upper surface of the drive chip is attached onto the glass substrate, the input end is disposed adjacent to the TFT substrate, and the output end is disposed away from the TFT substrate; and when the drive chip is not rotated, the lower surface of the drive chip is attached onto the glass substrate, the output end is disposed adjacent to the TFT substrate, and the input end is disposed away from the TFT substrate.

According to one embodiment of the present invention, the flexible printed circuit board further comprises a first extended portion and a second extended portion connected to the first connection portion and the second connection portion respectively, the first extended portion and the first connection portion form a U shape, and the second connection portion and the second extended portion form a U shape.

According to one embodiment of the present invention, the conductive leads of the flexible printed circuit board protrude from the bottom border and are not connected to the glass substrate.

According to one embodiment of the present invention, the display panel further comprises a display region and a non-display region surrounding the display region, and the bottom border is disposed in the non-display region.

The present invention provides a display device, comprising:

a display panel comprising a glass substrate and a thin film transistor (TFT) substrate disposed on the glass substrate, wherein the glass substrate comprises a bottom border protruding from one side of the TFT substrate;

a drive chip attached on the bottom border of the glass substrate, the drive chip comprising an output end and an input end disposed opposite to each other and two side surfaces adjacent and connected to the output end and the input end, the input end connected to a first metal layer of the TFT substrate, the output end connected to a second metal layer of the TFT substrate; and a flexible printed circuit board comprising a plurality of conductive leads and a first connection portion and a second connection portion, the first connection portion and the second connection portion extended from one side of the conductive leads, the first connection portion and the second connection portion connected to the input end from the two side surfaces respectively, the output end transmitting an output signal to the display panel through the second metal layer.

According to one embodiment of the present invention, when the first connection portion and the second connection portion are connected to the input end, the first connection portion and the second connection portion are connected to the drive chip at a horizontal flush, higher, or lower level than a height of the drive chip.

According to one embodiment of the present invention, the first metal layer and the second metal layer are disposed at different layers, the first metal layer is a gate electrode layer, and the second metal layer is a source/drain electrode layer.

According to one embodiment of the present invention, the drive chip comprises an upper surface and a lower surface disposed opposite to each other; when the drive chip is rotated by 180 degrees, the upper surface of the drive chip is attached onto the glass substrate, the input end is disposed adjacent to the TFT substrate, and the output end is disposed away from the TFT substrate; and when the drive chip is not rotated, the lower surface of the drive chip is attached onto the glass substrate, the output end is disposed adjacent to the TFT substrate, and the input end is disposed away from the TFT substrate.

According to one embodiment of the present invention, the flexible printed circuit board further comprises a first extended portion and a second extended portion connected to the first connection portion and the second connection portion respectively, the first extended portion and the first connection portion form a U shape, and the second connection portion and the second extended portion form a U shape.

According to one embodiment of the present invention, the conductive leads of the flexible printed circuit board protrude from the bottom border and are not connected to the glass substrate.

According to one embodiment of the present invention, the display panel further comprises a display region and a non-display region surrounding the display region, and the bottom border is disposed in the non-display region.

The present invention has the following advantages. In the present invention, the drive chip is rotated by 180 degrees and then is attached onto the glass substrate, or the drive chip is not rotated and then is attached onto the glass substrate (after rotation, the input end and the output end of the drive chip are arranged in positions opposite to positions of an input end and an output end of a conventional drive chip). The flexible printed circuit board located under the drive chip is divided into the first connection portion and the second connection portion which are used to connect the two side surfaces of the drive chip at a horizontal level flush with the drive chip, thereby effectively reducing a size of the bottom border and a thickness of the display panel. Then, the upper surface (or the lower surface or the two side surfaces) of the drive chip is connected to the input end of the drive chip through, but not limited to, a first metal layer. An output signal (from the output end) of the drive chip is output to the display panel through, but not limited to, the second metal layer. Therefore, the bottom border can reduce a height/space taken up by the flexible printed circuit board and reduce a wring distance between the flexible printed circuit board and the drive chip, thereby effectively reducing the size of the bottom border, reducing an overall thickness of the display module, and increasing a screen ratio.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

References to "embodiments" in the detailed description mean that the specific features, structures or characteristics described in connection with the embodiments may be included in at least one embodiment of the invention. The same terms mentioned in different places in the specification are not necessarily limited to the same embodiment, but should be understood as independent or alternative embodiments to other embodiments. In view of the technical solutions disclosed in the embodiments of the present invention, those skilled in the art should understand that the embodiments described herein may have other combinations or modifications in accordance with the embodiments of the present invention.

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

Referring to FIGS. 1 to 4, the present invention provides a narrow-bezel display module. The narrow-bezel display module comprises a display panel, a drive chip, and a flexible printed circuit board. The narrow-bezel display module referred to herein can be used in a smartphone, a display device, a notebook computer, a television, or other devices having a liquid crystal display (LCD).

Figure 1:
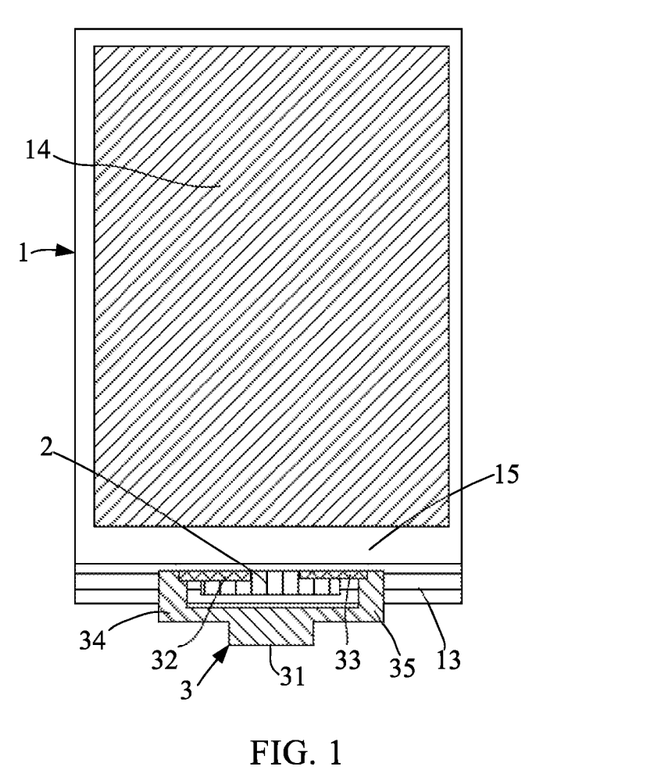
FIG. 1 is a schematic planar view according to a first embodiment of the present invention.
Figure 2:
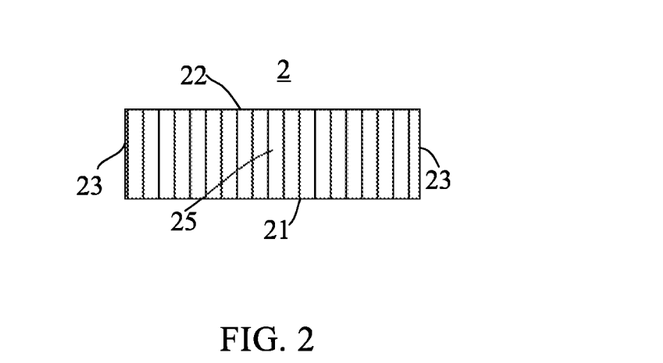
FIG. 2 is a schematic planar view illustrating a drive chip according to the first embodiment of the present invention.
Figure 3:
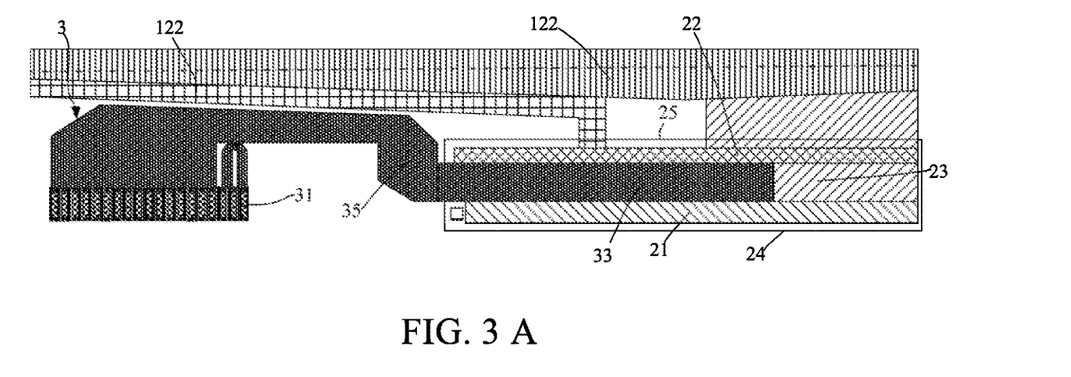
FIG. 3A is a cross-sectional view illustrating a wiring configuration according to the first embodiment of the present invention.
FIG. 3B is another cross-sectional view illustrating the wiring configuration according to the first embodiment of the present invention.
Figure 4:
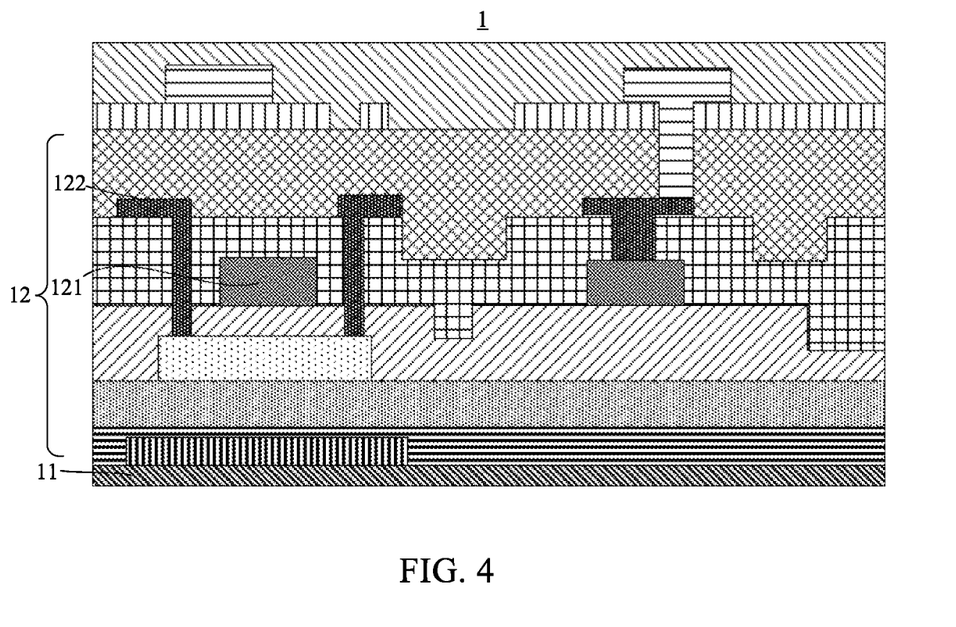
FIG. 4 is a partial cross-sectional view illustrating a display panel of the present invention.

Referring to FIGS. 1, 2, and 4, a display panel 1 comprising a glass substrate 11 and a thin film transistor (TFT) substrate 12 disposed on the glass substrate 11. The glass substrate 11 includes a bottom border 13 protruding from one side of the TFT substrate 12. A drive chip 2 is attached on the bottom border 13 of the glass substrate 11. The drive chip 2 comprises an output end 21 and an input end 22 disposed opposite to each other and two side surfaces 23 adjacent and connected to the output end 21 and the input end 22.

The input end 22 is connected to a first metal layer 121 of the TFT substrate 12, and the output end 21 is connected to a second metal layer 122 of the TFT substrate 12. The flexible printed circuit (FPC) board 3 comprises a plurality of conductive leads 31 and a first connection portion 32 and a second connection portion 33. The first connection portion 32 and the second connection portion 33 are extended from one side of the conductive leads 31. The first connection portion 32 and the second connection portion 33 are connected to the input end 22 from the two side surfaces 23 respectively. The output end 22 transmits an output signal to the display panel 1 through the second metal layer 122. The drive chip 2 comprises an upper surface 24 and a lower surface 25 disposed opposite to each other.

Please refer to FIG. 3A, which is a cross-sectional view illustrating a wiring configuration according to a first embodiment of the present invention. FIG. 3A is also a cross-sectional view between the drive chip 2 and the flexible printed circuit board 3. When the drive chip 2 is rotated by 180 degrees, the upper surface 24 of the drive chip 2 is attached onto the glass substrate 11, the input end 22 is disposed adjacent to the TFT substrate 12, and the output end 21 is disposed away from the TFT substrate 12. In detail, the first connection portion 32 and the second connection portion 33 are connected to the input end 22 adjacent to the side surface 23 by bending the flexible printed circuit board 3 multiple times, thereby effectively reducing a size of the bottom border 13 and also reducing a thickness of the display panel 1. However, in the embodiment of FIG. 3B, the first connection portion 32 and the second connection portion 33 may also be connected from the lower surface 25 to the input end 22 of the drive chip 2; configuration may vary as needed.

In the embodiment shown in FIG. 4, the first metal layer 121 and the second metal layer 122 are disposed at different layers. Therefore, even if the first metal layer 121 and the second metal layer 122 overlap each other, no short circuit is caused. In the present embodiment, the first metal layer 121 is a gate electrode layer, and the second metal layer 122 is a source/drain electrode layer. However, in alternative embodiments, the first metal layer 121 or the second metal layer 122 may also be other different metal layers in the TFT substrate 12; configuration may vary as required.

Please refer to FIG. 5 to FIG. 7B, which are schematic views according to a second embodiment of the present invention. The difference between the second embodiment and the first embodiment described above is that the drive chip 2 is not rotated, the lower surface 25 of the drive chip 2 is attached to the glass substrate 11. The output end 21 is disposed adjacent to the TFT substrate 12, and the input end 22 is disposed away from the TFT substrate 12.

Figure 7A:
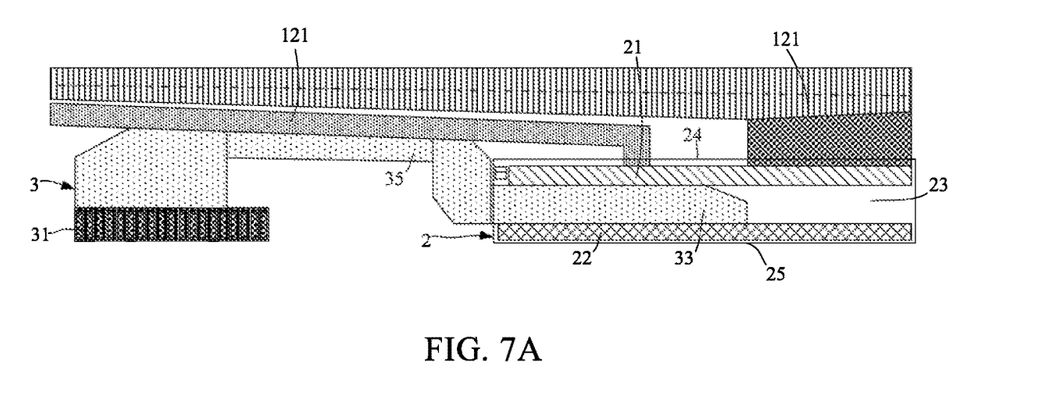
FIG. 7A is a cross-sectional view illustrating the wiring configuration according to the second embodiment of the present invention.

As shown in FIG. 7A, the first connection portion 32 and the second connection portion 33 are connected to the input end 22 of the side surface 23 after the flexible printed circuit board 3 is bent multiple times, thereby effectively reducing a size of the bottom border 13 and also reducing a thickness of the display panel 1. However, in the embodiment of FIG. 7B, the first connection portion 32 and the second connection portion 33 may also be connected from the upper surface 24 to the input end 22 of the drive chip 2; configuration may vary as required.

Figure 7B:
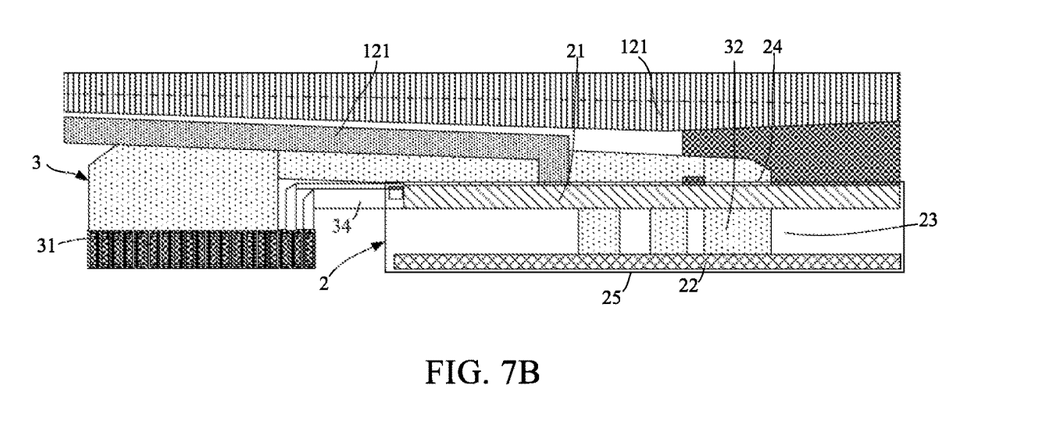
FIG. 7B is another cross-sectional view illustrating the wiring configuration according to the second embodiment of the present invention.

Furthermore, the flexible printed circuit board 3 further comprises a first extended portion 34 and a second extended portion 35 connected to the first connection portion 32 and the second connection portion 33 respectively. The first extended portion 34 and the first connection portion 32 form a U shape, and the second connection portion 33 and the second extended portion 35 form a U shape, thus effectively reducing a wiring distance between the flexible printed circuit board 3 and the drive chip 2. Furthermore, the conductive leads 31 of the flexible printed circuit board 3 protrude from the bottom border 13 and are not connected to the glass substrate 11. As a result, the conductive leads 31 can be bent to the other side of the bottom border 13, and thus the size of the bottom border 13 is reduced.

Figure 5:
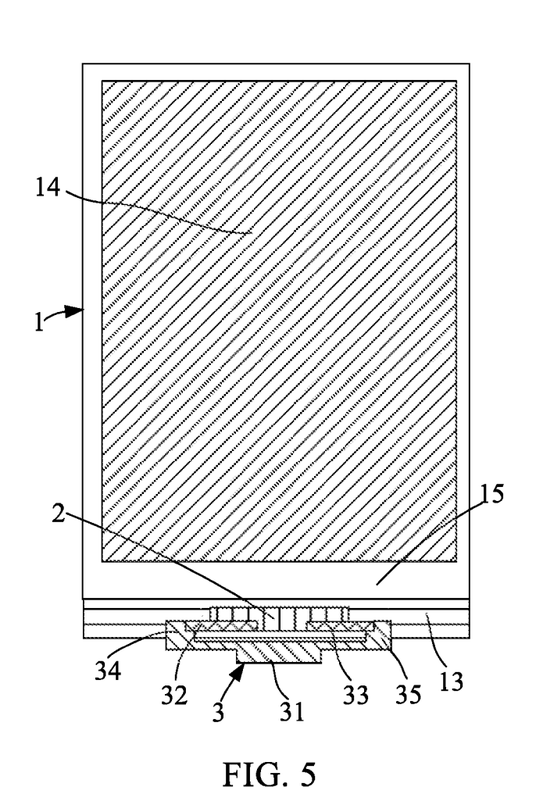
FIG. 5 is a schematic planar view according to a second embodiment of the present invention.
Figure 6:
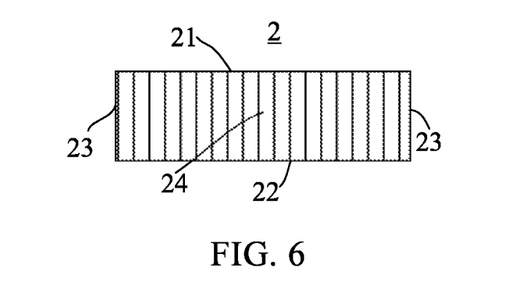
FIG. 6 is a schematic planar view illustrating a drive chip according to the second embodiment of the present invention.

In the embodiment shown in FIGS. 1 and 5, the display panel 1 further comprises a display region 14 and a non-display region 15 surrounding the display region 14, and the bottom border 13 is disposed in the non-display region 15. Therefore, the drive chip 2 of the present embodiment is, for example, an integrated circuit (IC) that drives an in-cell touch panel, and is directly attached to the glass substrate 11 (known as a chip-on-glass process, or so-called COG). The display panel 1 is easy and fast to produce and at low costs.

The present invention further provides a display device. The display device comprises the narrow-bezel display module of the above-mentioned embodiment. The display device is preferably a liquid crystal display (LCD) panel. In an alternative embodiment, the display device can also be an organic light emitting diode (OLED) device or other suitable devices.

In the present invention, the drive chip 2 is rotated by 180 degrees or not rotated and then attached unto the glass substrate 1. The flexible printed circuit board 3 located under the drive chip 2 is divided into a first connection portion 32 and a second connection portion 33 which are connected to the two side surfaces of the drive chip 2 at a horizontal level flush with the drive chip 2 (or at a horizontal level higher or lower than the drive chip), so the size of the bottom border 13 and the thickness of the display panel 1 are effectively reduced. Then, the upper surface 24 (or the lower surface 25 or the side surfaces 23) of the drive chip 2 is connected to the input end 22 of the drive chip 2 through, but not limited to, the first metal layer 121. An output signal of the drive chip 2 (i.e., the output terminal 21) is output to the display panel 1 through, but not limited to the second metal layer 122.

Therefore, the bottom border 13 can reduce the height/space taken up by the flexible printed circuit board 3 and a wiring distance between the flexible printed circuit board 3 and the drive chip 2, thereby effectively reducing the size of the bottom border 13 and reducing the overall thickness of the display module, and thus increasing a screen ratio and enlarging an active area 14 (abbreviated as AA) to improve visual experiences and product design aesthetics.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A narrow-bezel display module, comprising:
   a display panel comprising a glass substrate and a thin film transistor (TFT) substrate disposed on the glass substrate, wherein the glass substrate comprises a bottom border protruding from one side of the TFT substrate;
   a drive chip attached on the bottom border of the glass substrate, the drive chip comprising an output end and an input end disposed opposite to each other and two side surfaces adjacent and connected to the output end and the input end, the input end connected to a first metal layer of the TFT substrate, the output end connected to a second metal layer of the TFT substrate; and
   a flexible printed circuit board comprising a plurality of conductive leads and a first connection portion and a second connection portion, the first connection portion and the second connection portion extended from one side of the conductive leads, the first connection portion and the second connection portion connected to the input end from the two side surfaces respectively, the output end transmitting an output signal to the display panel through the second metal layer, wherein when the first connection portion and the second connection portion are connected to the input end, the first connection portion and the second connection portion are connected to the drive chip at a horizontal flush, higher, or lower level than a height of the drive chip.

2. The narrow-bezel display module according to claim 1, wherein the first metal layer and the second metal layer are disposed at different layers, the first metal layer is a gate electrode layer, and the second metal layer is a source/drain electrode layer.

3. The narrow-bezel display module according to claim 1, wherein the drive chip comprises an upper surface and a lower surface disposed opposite to each other; when the drive chip is rotated by 180 degrees, the upper surface of the drive chip is attached onto the glass substrate, the input end is disposed adjacent to the TFT substrate, and the output end is disposed away from the TFT substrate; and when the drive chip is not rotated, the lower surface of the drive chip is attached onto the glass substrate, the output end is disposed adjacent to the TFT substrate, and the input end is disposed away from the TFT substrate.

4. The narrow-bezel display module according to claim 1, wherein the flexible printed circuit board further comprises a first extended portion and a second extended portion connected to the first connection portion and the second connection portion respectively, the first extended portion and the first connection portion form a U shape, and the second connection portion and the second extended portion form a U shape.

5. The narrow-bezel display module according to claim 1, wherein the conductive leads of the flexible printed circuit board protrude from the bottom border and are not connected to the glass substrate.

6. The narrow-bezel display module according to claim 1, wherein the display panel further comprises a display region and a non-display region surrounding the display region, and the bottom border is disposed in the non-display region.

7. A narrow-bezel display module, comprising:
   a display panel comprising a glass substrate and a thin film transistor (TFT) substrate disposed on the glass substrate, wherein the glass substrate comprises a bottom border protruding from one side of the TFT substrate;
   a drive chip attached on the bottom border of the glass substrate, the drive chip comprising an output end and an input end disposed opposite to each other and two side surfaces adjacent and connected to the output end and the input end, the input end connected to a first metal layer of the TFT substrate, the output end connected to a second metal layer of the TFT substrate; and
   a flexible printed circuit board comprising a plurality of conductive leads and a first connection portion and a second connection portion, the first connection portion and the second connection portion extended from one side of the conductive leads, the first connection portion and the second connection portion connected to the input end from the two side surfaces respectively, the output end transmitting an output signal to the display panel through the second metal layer.

8. The narrow-bezel display module according to claim 7, wherein when the first connection portion and the second connection portion are connected to the input end, the first connection portion and the second connection portion are connected to the drive chip at a horizontal flush, higher, or lower level than a height of the drive chip.

9. The narrow-bezel display module according to claim 7, wherein the first metal layer and the second metal layer are disposed at different layers, the first metal layer is a gate electrode layer, and the second metal layer is a source/drain electrode layer.

10. The narrow-bezel display module according to claim 7, wherein the drive chip comprises an upper surface and a lower surface disposed opposite to each other; when the drive chip is rotated by 180 degrees, the upper surface of the drive chip is attached onto the glass substrate, the input end is disposed adjacent to the TFT substrate, and the output end is disposed away from the TFT substrate; and when the drive chip is not rotated, the lower surface of the drive chip is attached onto the glass substrate, the output end is disposed adjacent to the TFT substrate, and the input end is disposed away from the TFT substrate.

11. The narrow-bezel display module according to claim 7, wherein the flexible printed circuit board further comprises a first extended portion and a second extended portion connected to the first connection portion and the second connection portion respectively, the first extended portion and the first connection portion form a U shape, and the second connection portion and the second extended portion form a U shape.

12. The narrow-bezel display module according to claim 7, wherein the conductive leads of the flexible printed circuit board protrude from the bottom border and are not connected to the glass substrate.

13. The narrow-bezel display module according to claim 7, wherein the display panel further comprises a display region and a non-display region surrounding the display region, and the bottom border is disposed in the non-display region.

14. A display device, comprising:
a display panel comprising a glass substrate and a thin film transistor (TFT) substrate disposed on the glass substrate, wherein the glass substrate comprises a bottom border protruding from one side of the TFT substrate;
a drive chip attached on the bottom border of the glass substrate, the drive chip comprising an output end and an input end disposed opposite to each other and two side surfaces adjacent and connected to the output end and the input end, the input end connected to a first metal layer of the TFT substrate, the output end connected to a second metal layer of the TFT substrate; and
a flexible printed circuit board comprising a plurality of conductive leads and a first connection portion and a second connection portion, the first connection portion and the second connection portion extended from one side of the conductive leads, the first connection portion and the second connection portion connected to the input end from the two side surfaces respectively, the output end transmitting an output signal to the display panel through the second metal layer.

15. The display device according to claim 14, wherein when the first connection portion and the second connection portion are connected to the input end, the first connection portion and the second connection portion are connected to the drive chip at a horizontal flush, higher, or lower level than a height of the drive chip.

16. The display device according to claim 14, wherein the first metal layer and the second metal layer are disposed at different layers, the first metal layer is a gate electrode layer, and the second metal layer is a source/drain electrode layer.

17. The display device according to claim 14, wherein the drive chip comprises an upper surface and a lower surface disposed opposite to each other; when the drive chip is rotated by 180 degrees, the upper surface of the drive chip is attached onto the glass substrate, the input end is disposed adjacent to the TFT substrate, and the output end is disposed away from the TFT substrate; and when the drive chip is not rotated, the lower surface of the drive chip is attached onto the glass substrate, the output end is disposed adjacent to the TFT substrate, and the input end is disposed away from the TFT substrate.

18. The display device according to claim 14, wherein the flexible printed circuit board further comprises a first extended portion and a second extended portion connected to the first connection portion and the second connection portion respectively, the first extended portion and the first connection portion form a U shape, and the second connection portion and the second extended portion form a U shape.

19. The display device according to claim 14, wherein the conductive leads of the flexible printed circuit board protrude from the bottom border and are not connected to the glass substrate.

20. The display device according to claim 14, wherein the display panel further comprises a display region and a non-display region surrounding the display region, and the bottom border is disposed in the non-display region.

* * * * *